US011650500B2

(12) United States Patent
Lin et al.

(10) Patent No.: US 11,650,500 B2
(45) Date of Patent: *May 16, 2023

(54) PHOTORESIST AND METHOD OF FORMATION AND USE

(71) Applicant: Taiwan Semiconductor Manufacturing Co., Ltd., Hsinchu (TW)

(72) Inventors: Keng-Chu Lin, Ping-Tung (TW); Joung-Wei Liou, Zhudong (TW); Cheng-Han Wu, Taichung (TW); Ya Hui Chang, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 313 days.

This patent is subject to a terminal disclaimer.

(21) Appl. No.: 17/007,897

(22) Filed: Aug. 31, 2020

(65) Prior Publication Data

US 2020/0393763 A1 Dec. 17, 2020

Related U.S. Application Data

(60) Continuation of application No. 15/156,019, filed on May 16, 2016, now Pat. No. 10,761,427, which is a division of application No. 13/973,512, filed on Aug. 22, 2013, now Pat. No. 9,341,945.

(51) Int. Cl.
| | |
|---|---|
| *G03F 7/16* | (2006.01) |
| *G03F 7/038* | (2006.01) |
| *H01L 21/027* | (2006.01) |
| *H01L 21/311* | (2006.01) |
| *H01L 21/3213* | (2006.01) |
| *G03F 7/039* | (2006.01) |
| *G03F 7/11* | (2006.01) |
| *G03F 7/20* | (2006.01) |
| *G03F 7/32* | (2006.01) |

(52) U.S. Cl.
CPC ............ *G03F 7/0388* (2013.01); *G03F 7/038* (2013.01); *G03F 7/0382* (2013.01); *G03F 7/0397* (2013.01); *G03F 7/11* (2013.01); *G03F 7/167* (2013.01); *G03F 7/2041* (2013.01); *G03F 7/322* (2013.01); *G03F 7/325* (2013.01); *H01L 21/0271* (2013.01); *H01L 21/31144* (2013.01); *H01L 21/32139* (2013.01)

(58) Field of Classification Search
CPC .......... G03F 7/0384; G03F 7/167; G03F 7/16; G03F 7/0397
See application file for complete search history.

(56) References Cited

U.S. PATENT DOCUMENTS

| | | | |
|---|---|---|---|
| 3,993,489 A | 11/1976 | Heimsch et al. | |
| 4,072,527 A | 2/1978 | Fan | |
| 4,212,935 A | 7/1980 | Canavello et al. | |
| 4,268,601 A | 5/1981 | Namiki et al. | |
| 4,289,845 A | 9/1981 | Bowden et al. | |
| 4,346,164 A | 8/1982 | Tabarelli et al. | |
| 4,382,985 A | 5/1983 | Hattori et al. | |
| 4,491,628 A | 1/1985 | Ito et al. | |
| 4,663,275 A | 5/1987 | West et al. | |
| 4,777,119 A | 10/1988 | Brault et al. | |
| 4,939,070 A | 7/1990 | Brunsvold et al. | |
| 5,002,850 A | 3/1991 | Shinozaki et al. | |
| 5,268,260 A | 12/1993 | Bantu et al. | |
| 5,288,588 A | 2/1994 | Yukawa et al. | |
| 5,738,975 A | 4/1998 | Nakano et al. | |
| 5,750,312 A | 5/1998 | Chandross et al. | |
| 5,766,824 A | 6/1998 | Batchelder et al. | |
| 5,792,594 A | 8/1998 | Brown et al. | |
| 5,856,065 A | 1/1999 | Hagen | |
| 5,863,710 A | 1/1999 | Wakiya et al. | |
| 5,886,102 A | 3/1999 | Sinta et al. | |
| 5,889,141 A | 3/1999 | Marrocco, III et al. | |
| 6,008,265 A | 12/1999 | Vallee et al. | |
| 6,147,249 A | 11/2000 | Watanabe et al. | |
| 6,187,504 B1 | 2/2001 | Suwa et al. | |
| 6,306,554 B1 | 10/2001 | Barclay et al. | |
| 6,627,377 B1 | 9/2003 | Itatani et al. | |
| 6,787,289 B2 | 9/2004 | Yamada et al. | |

(Continued)

FOREIGN PATENT DOCUMENTS

| | | |
|---|---|---|
| EP | 1500977 A1 | 1/2005 |
| JP | 2006145788 A | 6/2006 |

(Continued)

OTHER PUBLICATIONS

Hoo, Ng Wah et al., "The Effect of UPW Quality on Photolithography Defect," Proc. SPIE 7520, Lithography Asia 2009, Dec. 14, 2009, 7 pages, vol. 7520, SPIE, Taipei, Taiwan.

Kitano, Junichi et al., "Resist pattern collapse prevention for the sub-90nm node," Microlithography World, May 2004, pp. 18-24, PennWell Publishing Corp.

Kunz, Roderick R., Kunz SPIE Short Course, 21 pages, MIT Lincoln Library, 2002, publisher unknown.

Lau, Aldrich N. K. et al., "New Thermal Cross-Linkers Based on Triazene: Cross-Linking of Fluorinated Polyimides and Aromatic Polymers," Macromolecules, 1992, pp. 7294-7299, vol. 25.

Reiser, Arnost, Photoreactive Polymers: The Science and Technology of Resists, Feb. 1989, 409 pages, Wiley-Interscience, New York.

(Continued)

*Primary Examiner* — Daborah Chacko-Davis
(74) *Attorney, Agent, or Firm* — Slater Matsil, LLP

(57) ABSTRACT

A system and method for depositing a photoresist and utilizing the photoresist are provided. In an embodiment a deposition chamber is utilized along with a first precursor material comprising carbon-carbon double bonds and a second precursor material comprising repeating units to deposit the photoresist onto a substrate. The first precursor material is turned into a plasma in a remote plasma chamber prior to being introduced into the deposition chamber. The resulting photoresist comprises a carbon backbone with carbon-carbon double bonds.

20 Claims, 4 Drawing Sheets

(56) References Cited

U.S. PATENT DOCUMENTS

| | | | |
|---|---|---|---|
| 6,788,477 B2 | 9/2004 | Lin | |
| 6,790,579 B1 | 9/2004 | Goodall et al. | |
| 6,835,527 B2 | 12/2004 | Takata et al. | |
| 6,852,473 B2 | 2/2005 | Roberts et al. | |
| 6,872,503 B2 | 3/2005 | Wheland et al. | |
| 6,875,554 B2 | 4/2005 | Hatanaka et al. | |
| 6,936,400 B2 | 8/2005 | Takasu et al. | |
| 6,952,253 B2 | 10/2005 | Lof et al. | |
| 6,991,888 B2 | 1/2006 | Padmanaban et al. | |
| 7,195,860 B2 | 3/2007 | Endo et al. | |
| 7,235,348 B2 | 6/2007 | Ho et al. | |
| 7,264,918 B2 | 9/2007 | Endo et al. | |
| 7,312,014 B2 | 12/2007 | Maesawa et al. | |
| 7,320,855 B2 | 1/2008 | Huang et al. | |
| 7,344,970 B2 | 3/2008 | Forman et al. | |
| 7,362,412 B2 | 4/2008 | Holmes et al. | |
| 7,393,624 B2 | 7/2008 | Allen et al. | |
| 7,432,035 B2 | 10/2008 | Maeda et al. | |
| 7,432,042 B2 | 10/2008 | Chang et al. | |
| 7,460,206 B2 | 12/2008 | Weissenrieder et al. | |
| 7,470,503 B1 | 12/2008 | Brandl | |
| 7,582,398 B2 | 9/2009 | Iftime et al. | |
| 7,585,612 B2 | 9/2009 | Thackeray et al. | |
| 7,595,141 B2 | 9/2009 | Kudo et al. | |
| 7,608,386 B2 | 10/2009 | Nozaki et al. | |
| 7,648,815 B2 | 1/2010 | Itatani et al. | |
| 7,718,541 B2 | 5/2010 | Makiyama et al. | |
| 7,733,459 B2 | 6/2010 | Dierichs et al. | |
| 7,738,074 B2 | 6/2010 | Streefkerk et al. | |
| 7,779,781 B2 | 8/2010 | Mertens et al. | |
| 7,824,837 B2 | 11/2010 | Wu et al. | |
| 7,846,637 B2 | 12/2010 | Ishizuka et al. | |
| 7,879,529 B2 | 2/2011 | Endo et al. | |
| 7,919,222 B2 | 4/2011 | Vohra et al. | |
| 7,959,141 B2 | 6/2011 | Makino | |
| 7,985,534 B2 | 7/2011 | Tsubaki | |
| 7,989,578 B2 | 8/2011 | Wu | |
| 7,998,655 B2 | 8/2011 | Tsubaki | |
| 8,017,304 B2 | 9/2011 | Tarutani et al. | |
| 8,071,272 B2 | 12/2011 | Tsubaki | |
| 8,088,548 B2 | 1/2012 | Houlihan et al. | |
| 8,088,557 B2 | 1/2012 | Tsubaki | |
| 8,105,748 B2 | 1/2012 | Ohashi et al. | |
| 8,257,901 B2 | 9/2012 | Kim et al. | |
| 8,323,870 B2 | 12/2012 | Lee et al. | |
| 8,329,387 B2 | 12/2012 | Yao et al. | |
| 8,334,338 B2 | 12/2012 | Yoshimura et al. | |
| 8,460,856 B2 | 6/2013 | Yeh et al. | |
| 8,507,177 B2 | 8/2013 | Wang et al. | |
| 8,518,628 B2 | 8/2013 | Chang et al. | |
| 8,586,290 B2 | 11/2013 | Wang et al. | |
| 9,341,945 B2 * | 5/2016 | Lin | G03F 7/322 |
| 10,761,427 B2 * | 9/2020 | Lin | H01L 21/31144 |
| 2001/0044070 A1 | 11/2001 | Uetani et al. | |
| 2002/0015826 A1 | 2/2002 | Desmarteau et al. | |
| 2002/0051933 A1 | 5/2002 | Kodama et al. | |
| 2002/0068237 A1 | 6/2002 | Imai | |
| 2003/0022097 A1 | 1/2003 | Malik et al. | |
| 2003/0031953 A1 | 2/2003 | Hatakeyama et al. | |
| 2003/0073027 A1 | 4/2003 | Namiki et al. | |
| 2003/0079764 A1 | 5/2003 | Hirose et al. | |
| 2003/0087179 A1 | 5/2003 | Iwasaki | |
| 2003/0175624 A1 | 9/2003 | Nozaki et al. | |
| 2004/0084150 A1 | 5/2004 | George et al. | |
| 2004/0096780 A1 | 5/2004 | Nozaki et al. | |
| 2004/0161698 A1 | 8/2004 | Kanagasabapathy et al. | |
| 2004/0180299 A1 | 9/2004 | Rolland et al. | |
| 2005/0134817 A1 | 6/2005 | Nakamura | |
| 2005/0145803 A1 | 7/2005 | Hakey et al. | |
| 2005/0145821 A1 | 7/2005 | French et al. | |
| 2005/0225737 A1 | 10/2005 | Weissenrieder et al. | |
| 2005/0266354 A1 | 12/2005 | Li et al. | |
| 2005/0287466 A1 | 12/2005 | Miyamoto et al. | |
| 2006/0008736 A1 | 1/2006 | Kanda et al. | |
| 2006/0105267 A1 | 5/2006 | Khojasteh et al. | |
| 2006/0141400 A1 | 6/2006 | Hirayama et al. | |
| 2006/0204890 A1 | 9/2006 | Kodama | |
| 2006/0246373 A1 | 11/2006 | Wang | |
| 2006/0257781 A1 | 11/2006 | Benoit et al. | |
| 2006/0257785 A1 | 11/2006 | Johnson | |
| 2007/0031755 A1 | 2/2007 | Hirayama et al. | |
| 2007/0207406 A1 | 9/2007 | Guerrero et al. | |
| 2008/0113300 A2 | 5/2008 | Choi et al. | |
| 2008/0149135 A1 | 6/2008 | Cho et al. | |
| 2008/0160729 A1 | 7/2008 | Krueger et al. | |
| 2008/0187860 A1 | 8/2008 | Tsubaki et al. | |
| 2008/0241778 A1 | 10/2008 | Kulp | |
| 2009/0042147 A1 | 2/2009 | Tsubaki | |
| 2009/0305163 A1 | 12/2009 | Iwashita et al. | |
| 2009/0311624 A1 | 12/2009 | Horiguchi et al. | |
| 2010/0009271 A1 | 1/2010 | Takeda et al. | |
| 2010/0040971 A1 | 2/2010 | Tarutani et al. | |
| 2010/0239984 A1 | 9/2010 | Tsubaki | |
| 2011/0020755 A1 | 1/2011 | Tsubaki | |
| 2011/0097670 A1 | 4/2011 | Wang et al. | |
| 2011/0250543 A1 | 10/2011 | Tsubaki | |
| 2011/0263136 A1 | 10/2011 | Kim et al. | |
| 2012/0052687 A1 | 3/2012 | Raghavan et al. | |
| 2012/0171616 A1 | 7/2012 | Thackeray et al. | |
| 2012/0238106 A1 | 9/2012 | Chuang | |
| 2012/0282553 A1 | 11/2012 | Kimura et al. | |
| 2012/0308741 A1 | 12/2012 | Kim et al. | |
| 2012/0308939 A1 | 12/2012 | Kudo et al. | |
| 2014/0011133 A1 | 1/2014 | Liu et al. | |
| 2014/0087293 A1 | 3/2014 | Kandanarachchi et al. | |

FOREIGN PATENT DOCUMENTS

| | | |
|---|---|---|
| TW | I336819 B | 2/2011 |
| TW | I341961 B | 5/2011 |
| TW | I343513 B | 6/2011 |
| WO | 2005088397 A2 | 9/2005 |
| WO | 2006054432 A1 | 5/2006 |

OTHER PUBLICATIONS

Robertson, Stewart et al., "Physical Resist Simulation for a Negative Tone Development Process," 2010 International Symposium on Lithography Extension, Oct. 20-22, 2010, 19 pages.

Sekiguchi, Atsushi et al., "Analysis of Deprotection Reaction in Chemically Amplified Resists Using an Fourier Transform Infrared Spectrometer with an Exposure Tool," Japan J. Appl. Phys., Mar. 2000, pp. 1392-1398, vol. 39, Part 1, No. 3A.

Switkes, M. et al., "Extending optics to 50 nm and beyond with immersion lithography," Journal of Vacuum Science & Technology B: Microelectronics and Nanometer Structures, Nov./Dec. 2003, vol. 21, No. 6., pp. 2794-2799.

Tarutani, Shinji et al., "Process parameter influence to negative tone development process for double patterning," Proc. SPIE 7639, Advances in Resist Materials and Processing Technology XXVII, Mar. 29, 2010, 13 pages, vol. 7639.

Tsvetanova, D. et al., "Degradation of 248 nm Deep UV Photoresist by Ion Implantation," Journal of The Electromechanical Society, Jun. 10, 2011, 10 pages, vol. 158, Issue 8, The Electromechanical Society.

\* cited by examiner

PHOTORESIST AND METHOD OF FORMATION AND USE

This application is a continuation of U.S. patent application Ser. No. 15/156,019, filed on May 16, 2016, and entitled "Photoresist and Method of Formation and Use," which is a division of U.S. patent application Ser. No. 13/973,512, filed on Aug. 22, 2013, and entitled "Photoresist and Method of Formation and Use," now U.S. Pat. No. 9,341,945 issued on May 17, 2016, which applications are hereby incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface and then exposed to an energy that has itself been patterned. Such an exposure modifies the chemical and physical properties of the exposed regions of the photolithographic material. This modification, along with the lack of modification in regions of the photolithographic material that were not exposed, can be exploited to remove one region without removing the other.

However, as the size of individual devices has decreased, process windows for photolithographic processing as become tighter and tighter. As such, advances in the field of photolithographic processing have been necessitated in order to keep up the ability to scale down the devices, and further improvements are needed in order to meet the desired design criteria such that the march towards smaller and smaller components may be maintained.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a photoresist that is applied using a chemical vapor deposition process and its method of use. Other embodiments may also be applied, however, to other photoresists and methods.

Figure 1:
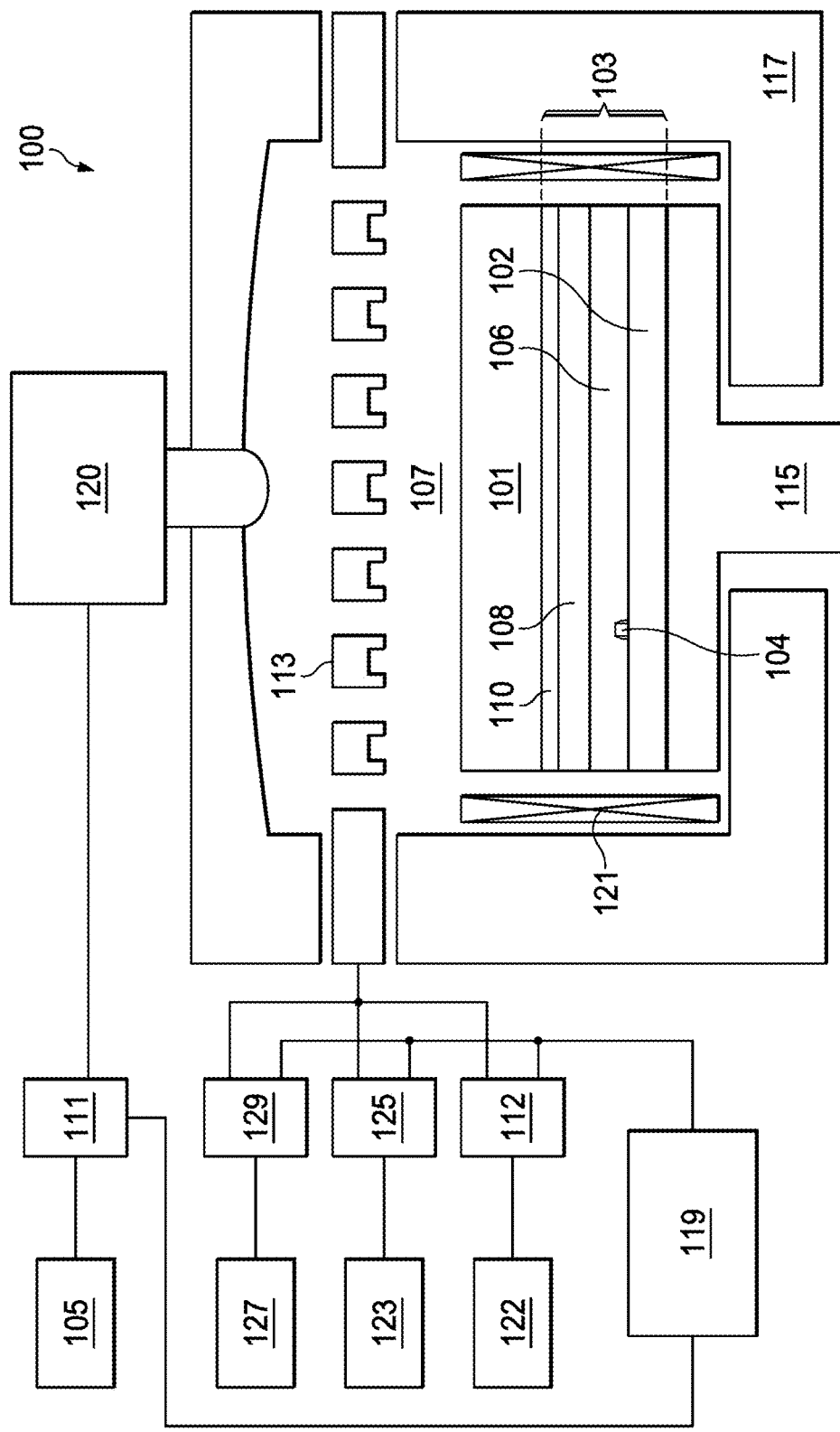
FIG. 1 illustrates a deposition chamber with a plasma generator to deposit a photoresist in accordance with an embodiment.

With reference now to FIG. 1, there is shown a deposition system 100 using remote plasma that may be utilized to form a photoresist 101 on a substrate 103 in a process such as chemical vapor deposition. However, while the embodiment is described with reference to a photoresist 101 for use in semiconductor manufacturing, the embodiments are not limited to a semiconductor manufacturing. Rather, any process that utilizes a photoresist may benefit from the embodiments. All such processes and photoresists are fully intended to be included within the scope of the embodiments.

In an embodiment the substrate 103 may be a semiconductor device with a semiconductor substrate 102, active devices 104 on the semiconductor substrate 102, an interlayer dielectric (ILD) layer 106 over the active devices 104, metallization layers 108 over the ILD layer 106, a layer to be patterned 110 over the ILD layer 106, and a photoresist over the layer to be patterned 110. The semiconductor substrate 102 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 104 are represented in FIG. 1 as a single transistor. However, as one of skill in the art will recognize, a wide variety of active devices 104 such as capacitors, resistors, inductors and the like may be used to generate the desired structural and functional requirements of the design for the semiconductor device. The active devices 104 may be formed using any suitable methods either within or else on the surface of the semiconductor substrate 102.

The ILD layer 106 may comprise a material such as boron phosphorous silicate glass (BPSG), although any suitable dielectrics may be used for either layer. The ILD layer 106 may be formed using a process such as PECVD, although other processes, such as LPCVD, may alternatively be used. The ILD layer 106 may be formed to a thickness of between about 100 Å and about 3,000 Å.

The metallization layers 108 are formed over the semiconductor substrate 102, the active devices, and the ILD layer 106 and are designed to connect the various active devices 104 to form functional circuitry. While illustrated in FIG. 1 as a single layer, the metallization layers 108 are formed of alternating layers of dielectric and conductive material and may be formed through any suitable process (such as deposition, damascene, dual damascene, etc.). In an embodiment there may be four layers of metallization separated from the semiconductor substrate 102 by the ILD layer 106, but the precise number of metallization layers 108 is dependent upon the design of the semiconductor device.

A layer to be patterned 110 or otherwise processed using the photoresist 101 is formed over the metallization layers 108. The layer to be patterned 110 may be an upper layer of the metallization layers 108 or else may be a dielectric layer (such as a passivation layer) formed over the metallization layers 108. In an embodiment in which the layer to be patterned 110 is a metallization layer, the layer to be patterned 110 may be formed of a conductive material using processes similar to the processes used for the metallization layers 108 (e.g., damascene, dual damascene, deposition, etc.). Alternatively, if the layer to be patterned 110 is a dielectric layer the layer to be patterned 110 may be formed of a dielectric material using such processes as deposition, oxidation, or the like.

However, as one of ordinary skill in the art will recognize, while materials, processes, and other details are described in the embodiments, these details are merely intended to be illustrative of embodiments, and are not intended to be limiting in any fashion. Rather, any suitable layer, made of any suitable material, by any suitable process, and any suitable thickness, may alternatively be used. All such layers are fully intended to be included within the scope of the embodiments.

In an embodiment the deposition system 100 may utilize two or more precursor materials to form the photoresist 101. For example, the deposition system 100 may receive precursor materials from a first precursor delivery system 105 and a second precursor delivery system 122 to form the photoresist 101 onto the substrate 103. The formation of the photoresist 101 may be performed in a deposition chamber 107 which receives the first precursor material and the second precursor material.

The first precursor delivery system 105 and the second precursor delivery system 122 may work in conjunction with one another to supply the various different precursor materials to the deposition chamber 107. In an embodiment in which the first precursor material is in a gaseous state during preparation and storage (e.g., a first precursor material such as propene), the first precursor delivery system 105 may comprise a first precursor material supplier, such as a gas storage tank or a machine to generate the first precursor material on an as-needed basis in order to supply it to a plasma block 120 (discussed further below).

Alternatively, in an embodiment where the first precursor material is either a liquid or solid precursor material, the first precursor delivery system 105 may comprise a carrier gas supply (not individually illustrated) and a precursor canister (also not individually illustrated) arranged in series. The carrier gas supply may be, e.g., an inert gas and may be used to help "carry" the precursor gas to the plasma block 120 and into the deposition chamber 107 and may be coupled to the precursor canister, which may be utilized to supply a desired precursor (e.g., the first precursor material) to the deposition chamber 107 by vaporizing or sublimating precursor materials that may be delivered in either a solid or liquid phase. The precursor canister may have a vapor region into which precursor material is driven into a gaseous phase so that the carrier gas may enter the precursor canister and pick-up or carry the gaseous precursor material out of the precursor canister and towards the deposition chamber 107.

The first precursor delivery system 105 is connected to and supplies the first precursor material to a first precursor gas controller 111, which may supply the first precursor material to the plasma block 120 before the first precursor material enters the deposition chamber 107. In an embodiment the first precursor gas controller may include such devices as valves, flow meters, sensors, and the like to control the connection and delivery rate of the first precursor material to the plasma block 120. The first precursor gas controller 111 may be controlled and receive instructions from a control unit 119.

The second precursor delivery system 122 may comprise components similar to the first precursor delivery system 105. For example, if the second precursor material is in a gaseous state during preparation and storage, the second precursor delivery system 122 may comprise a second precursor material supplier, such as a gas storage tank or a machine to generate the second precursor material on an as-needed basis. Alternatively, if the second precursor material is in a liquid or solid state during preparation and storage, the second precursor delivery system 122 may be implemented using a carrier gas and a sublimation/vaporization process.

The second precursor delivery system 122 may supply a stream of the second precursor material to, e.g., a second precursor gas controller 112, which may supply the second precursor material to a showerhead 113 without turning it into a plasma as the second precursor material (in a non-plasma phase) enters the deposition chamber 107. In an embodiment the second precursor gas controller 112 may be similar to the first precursor gas controller 111 (discussed above) and may include such devices as valves, flow meters, sensors, and the like to control the connection and delivery rate of the second precursor material to the showerhead 113. The second precursor gas controller 112 may also be controlled and receive instructions from the control unit 119.

The first precursor gas controller 111 and the second precursor gas controller 112, upon receiving instructions from the control unit 119, may open and/or close valves so as to connect the first precursor delivery system 105 and the second precursor delivery system 122 to the plasma block 120 and the deposition chamber 107, respectively, and direct the desired precursor materials to their respective destinations. For example, the first precursor gas controller 111 will direct the first precursor material to the plasma block 120 and the second precursor gas controller 112 will direct the second precursor material to the showerhead 113.

The showerhead 113 may be a multiple-zone showerhead utilized to disperse the chosen precursor materials into the deposition chamber 107 and may be designed to evenly disperse the precursor materials in order to minimize undesired process conditions that may arise from uneven dispersal. In an embodiment in which two precursor materials are utilized the showerhead 113 may have a dual dispersion design that accepts both the first precursor material (through, e.g., a first plasma inlet) and the second precursor material (through, e.g., a second inlet) at the same time and will disperse both the first precursor material and the second precursor material in an even distribution around the deposition chamber 107. The showerhead 113 may have a circular design with openings dispersed evenly around the showerhead 113 to allow for the dispersal of the first precursor material and the second precursor material into the deposition chamber 107.

The deposition chamber 107 may receive the desired precursor materials and expose the precursor materials to the substrate 103, and the deposition chamber 107 may be any desired shape that may be suitable for dispersing the precursor materials and contacting the precursor materials with the substrate 103. In the embodiment illustrated in FIG. 1, the deposition chamber 107 has a cylindrical sidewall and a bottom. Furthermore, the deposition chamber 107 may be surrounded by a housing 117 made of material that is inert to the various process materials. In an embodiment, the housing 117 may be steel, stainless steel, nickel, aluminum, alloys of these, or combinations of these.

Within the deposition chamber 107 the substrate 103 may be placed on a mounting platform 115 made of, e.g., aluminum, in order to position and control the substrate 103 during the deposition process. The mounting platform 115 may be rotatable and may include heating mechanisms in order to heat the substrate 103 during the deposition process. Furthermore, while a single mounting platform 115 is illustrated in FIG. 1, any number of mounting platforms 115 may additionally be included within the deposition chamber 107.

The deposition chamber 107 may also have pumping channels 121 for exhaust gases to exit the deposition chamber 107. A vacuum pump (not shown) may be connected to the pumping channels 121 of the deposition chamber 107 in order to help evacuate the exhaust gases. The vacuum pump, under control of the control unit 119, may also be utilized to reduce and control the pressure within the deposition chamber 107 to a desired pressure and may also be utilized to evacuate precursor materials from the deposition chamber 107 in preparation for the introduction of a purge gas.

Figure 2:
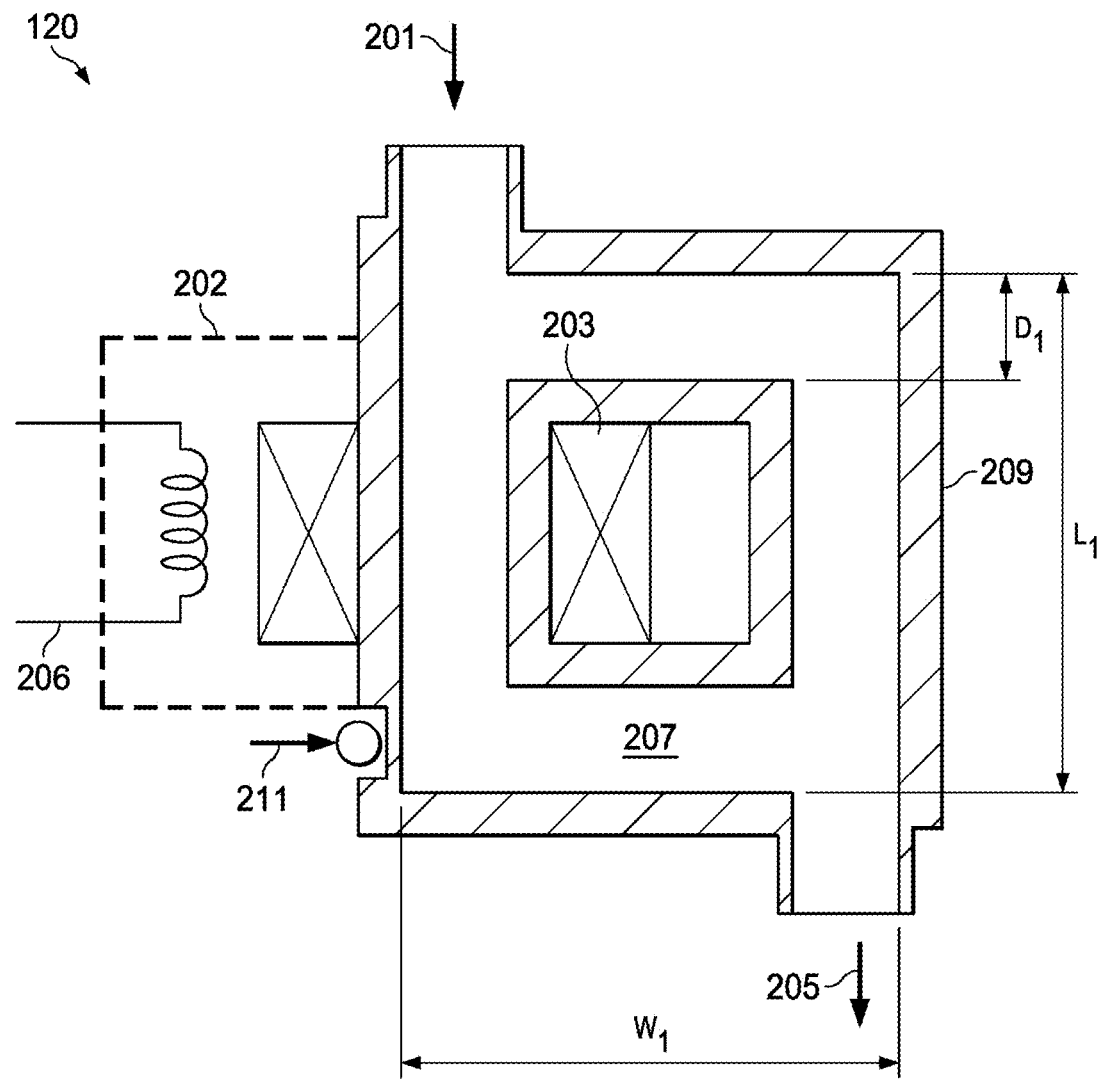
FIG. 2 illustrates a plasma generation unit in accordance with an embodiment.

FIG. 2 illustrates an embodiment of the plasma block 120 (or plasma generator) from FIG. 1 in greater detail. In an embodiment the plasma block 120 has an inlet port 201 that receives the first precursor material from the first precursor gas controller 111 and an outlet port 205 that is coupled to deliver a first precursor plasma (converted from the first precursor material) to the showerhead 113. The first precursor material enters the plasma block 120 and passes between a magnetic core 203 that surrounds a portion of the plasma block 120. The magnetic core 203 is utilized to induce the formation of the first precursor plasma from the first precursor material that enters the plasma block 120 before exiting out of an outlet port 205.

The magnetic core 203 may be situated around a portion of the flow path through the plasma block 120 from the inlet port 201 to the outlet port 205. In an embodiment the magnetic core 203 is one portion of a transformer 202 (illustrated in FIG. 2 with dashed line 202), with a primary coil 206 forming another portion of the transformer 202. In an embodiment the primary coil 206 may have a winding of between about 100 and about 1000 such as about 600.

To generate the desired first precursor plasma from the first precursor material within the plasma block 120, a short, high-voltage pulse of electricity controlled, e.g., by the control unit 119 (see FIG. 1) may be applied to the primary coil 206. The high-voltage pulse of electricity in the primary coil 206 is transformed to a pulse of energy into the magnetic core 203, which induces the formation of the first precursor plasma within the plasma block 120. In an embodiment the high-voltage pulse may be between about 10 kHz and about 30 MHz such as about 13.56 MHz. while the temperature is between about 50° C. and about 200° C. and with a pressure of between about 1 torr and about 20 torr.

However, while igniting the first precursor material with a magnetic coil is described as an embodiment that may be used with the embodiments, the embodiments are not so limited. Rather, any suitable method or structures may be used to ignite the first precursor material to form the first precursor plasma. For example, in alternative embodiments a high voltage pulse may be applied to an electrode (not illustrated) coupled to the plasma block 120, or the first precursor material may be exposed to a ultraviolet radiation that may be used to ignite the first precursor material and form the first precursor plasma. Any suitable method of igniting the first precursor material and any other suitable plasma inducing device are fully intended to be included within the scope of the embodiments.

The plasma block 120 comprises a circular path between the inlet port 201 and the outlet port 205 in which the first precursor material may travel. In an embodiment the circular path may have a first length $L_1$ of between about 100 mm and about 500 mm, such as about 250 mm, and a first width $W_1$ of between about 100 mm and about 500 mm such as about 250 mm. Similarly, the interior of the circular path through the plasma block may have a first diameter $D_1$ of between about 20 mm and about 150 mm, such as about 70 mm. However, any other suitable structure or shape may alternatively be utilized.

The plasma block 120 also comprises an inner housing 207 and an insulator 209 surrounding the inner housing 207. The insulator 209 may be used to electrically and thermally isolate the inner housing 207 of the plasma block 120. In an embodiment the inner housing 207 encloses and encapsulates the circular path of the first precursor material and (after ignition) the first precursor plasma in order to guide the first precursor material and the first precursor plasma through the plasma block 120.

The plasma block 120 may also comprise a sensor 211 that may be used to measure the conditions within the plasma block 120. In an embodiment the sensor 211 may be a current probe used to measure the current and power of the plasma as part of a feedback loop to the control unit 119 (see FIG. 1). In addition, or alternatively, the sensor 211 may also comprise an optical sensor or any other measurement devices that may be used to measure and control the plasma generation within the plasma block 120.

Returning to FIG. 1, the formation of the photoresist 101 may be initiated by putting a first precursor into the first precursor delivery system 105. For example, in an embodiment the first precursor may be an organic carbon chain that comprises at least one carbon-carbon double bond, such as propene ($C_3H_6$), butene ($C_4H_8$), pentene ($C_5H_{10}$), or the like. Additionally, the first precursor is not limited to only molecule chains comprising carbon and hydrogen. Rather, any suitable carbon chain with at least one carbon-carbon double bond may alternatively be utilized and other substituent atoms, such as oxygen atoms, nitrogen atoms, fluorine atoms, or the like, may be included along the organic carbon chain. The use of an organic carbon chain with at least one carbon-carbon double bond assists with forming a backbone of the photoresist that also includes carbon-carbon double bonds, as described further below.

Additionally, the first precursor is not limited to only linear carbon chains comprising carbon-carbon double bonds. Rather, any suitable organic molecule that comprises carbon-carbon double bonds that can form a linear carbon backbone with double bonds, may also be utilized. For example, in some embodiments the first precursor may comprise aromatic or non-aromatic polycyclic or alicyclic carbon rings. These molecules may be utilized as the first precursor as long as the molecules form a plasma precursor which, upon reaction with the second precursor, will form a carbon backbone that has at least a portion that is linear and wherein the linear portion comprises at least one carbon-carbon double bond.

Additionally, the second precursor material may be placed into or formed by the second precursor delivery system 122. In an embodiment to form the photoresist 101, the second precursor material may be one or more monomers that comprise a hydrocarbon structure (such as a alicyclic hydrocarbon structure) that contains one or more groups that will decompose (e.g., acid labile groups) or otherwise react when mixed with acids, bases, or free radicals generated by the PACs (as further described below). In an embodiment the hydrocarbon structure comprises a repeating unit that may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures which may be utilized for the repeating unit of the hydrocarbon structure include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In an embodiment the repeating unit of the hydrocarbon structure may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include adamantine, norbornane, isobornane, tricyclodecane, tetracycododecane, or the like.

The group which will decompose, otherwise known as a leaving group or an acid labile group (in an embodiment in which photoacid generators are used to initiate chemical reactions as further described below), is attached to the hydrocarbon structure so that, it will react with the acids/bases/free radicals generated during exposure. In an embodiment the group which will decompose may be a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkyl sulfonyl)(alkyl-carbonyl)imido group, a bis(alkylcarbonyl)methylene group, a bis(alkylcarbonyl) imido group, a bis(alkylsylfonyl)methylene group, a bis (alkylsulfonyl)imido group, a tris(alkylcarbonyl methylene group, a tris(alkylsulfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

In an embodiment the repeating unit may also comprise other groups attached to the hydrocarbon structure that help to improve a variety of properties of the polymerizable resin. For example, inclusion of a lactone group to the hydrocarbon structure assists to reduce the amount of line edge roughness after the photoresist 101 has been developed, thereby helping to reduce the number of defects that occur during development. In an embodiment the lactone groups may include rings having five to seven members, although any suitable lactone structure may alternatively be used for the lactone group.

The repeating unit may also comprise groups that can assist in increasing the adhesiveness of the photoresist 101 to underlying structures (e.g., the layer to be patterned 110). In an embodiment polar groups may be used to help increase the adhesiveness, and polar groups that may be used in this embodiment include hydroxyl groups, cyano groups, or the like, although any suitable polar group may alternatively be utilized.

Optionally, the repeating unit further comprises one or more alicyclic hydrocarbon structures that do not also contain a group which will decompose. In an embodiment the hydrocarbon structure that does not contain a group which will decompose may include structures such as 1-adamantyl (meth)acrylate, tricyclodecanyl (meth)acrylate, cyclohexayl (meth)acrylate, combinations of these, or the like.

In alternative embodiments the second precursor may comprise one or more repeating units bonded together in order to tune the precise characteristics of the desired photoresist. For example, in a particular embodiment two different monomers from the repeating units discussed above may be utilized as the second precursor. In a very particular embodiment the second precursor may comprise the following structure:

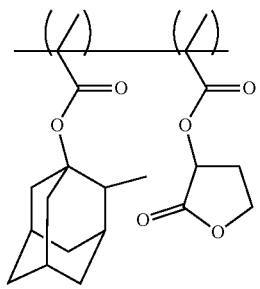

However, as one of ordinary skill in the art will recognize, the above presented example is intended to be illustrative only and is not intended to limit the scope. Rather, any suitable combination of monomers may be utilized, and all such combinations are fully intended to be included within the scope of the embodiments.

Once the first precursor material and the second precursor material are ready in the first precursor delivery system 105 and the second precursor delivery system 122, respectively, the formation of the photoresist 101 may be initiated by the control unit 119 sending an instruction to the first precursor gas controller 111 and the second precursor gas controller 112 to connect the first precursor delivery system 105 and the second precursor delivery system 122 to the deposition chamber 107. Once connected, the first precursor delivery system 105 can deliver the first precursor material (e.g., propene) to the showerhead 113 through the plasma block 120, with the plasma block 120 inducing the formation of the first precursor plasma as the first precursor material passes through the plasma block 120. The showerhead 113 can then disperse the first precursor plasma into the deposition chamber 107, wherein the first precursor plasma can be adsorbed and react on the exposed surface of the substrate 103.

In the embodiment in which the photoresist 101 is propene, the first precursor material may be flowed into the plasma block 120 at a flow rate of between about 100 sccm and about 2,000 sccm, such as about 500 sccm. Additionally, the deposition chamber 107 may be held at a pressure of between about 1 torr and about 20 torr, such as about 5 torr, and a temperature of between about 30° C. and about 200° C., such as about 70° C. However, as one of ordinary skill in the art will recognize, these process conditions are only intended to be illustrative, as any suitable process conditions may be utilized while remaining within the scope of the embodiments.

Optionally, a noble gas such as argon or helium, or another carrier gas such as nitrogen (N$_2$), may be added to the first precursor material before the first precursor material enters the plasma block 120. Such an introduction of a noble gas or carrier gas helps with the ignition of the first precursor material by lowering the voltage required to ignite the first precursor material into the first precursor plasma.

At the same time, the introduction of the second precursor material (e.g., a photoresist polymer precursor) to the deposition chamber 107 may be initiated by the control unit 119 sending an instruction to the second precursor gas controller 112 to connect the second precursor delivery system 122 (supplying the second precursor material) to the deposition chamber 107. Once connected, the second precursor delivery system 122 can deliver the second precursor material to the showerhead 113 at the same time, before, or after the first precursor plasma. The showerhead 113 can then disperse the second precursor material into the deposition chamber 107, wherein the second precursor material can react with the first precursor material to form the desired photoresist 101 on the substrate 103.

In the embodiment discussed above to form the photoresist 101, the second precursor material may be introduced into the deposition chamber 107 at a flow rate of between about 100 mg/min and about 5000 mg/min, such as about 500 mg/min. However, as one of ordinary skill in the art will recognize, these process conditions are only intended to be illustrative, as any suitable process conditions may be utilized to introduce oxygen while remaining within the scope of the embodiments.

By supplying the first precursor plasma to the deposition chamber 107 along with the second precursor material, the first precursor plasma and the second precursor material will react on the surface of the layer to be patterned 110 and form part of the desired photoresist 101 on the substrate 103. However, by using a first precursor material with carbon-carbon double bonds, the carbon atoms from the first precursor material (and, as such, the first precursor plasma), will combine to form a carbon backbone for the photoresist 101. Additionally, this carbon backbone will have carbon-carbon double bonds within it. In a particular embodiment, the carbon backbone will have anywhere from about 0% to about 40% of its carbon bonds being carbon-carbon double bonds.

The monomers or polymers within the second precursor material will also react with the first precursor plasma, and form bonds that join the various monomers or polymers to the carbon backbone. In a particular example, a portion of the photoresist 101 having part of the carbon backbone and the polymers has a structure similar to the following:

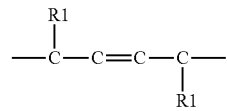

where R1 represents the monomers and polymers from the second precursor that are bonded to the carbon backbone. However, any suitable placement of the monomers and polymers from the second precursor material may alternatively be utilized, and all such placements and combinations are fully intended to be included within the scope of the embodiments.

In addition to forming the carbon backbone of the photoresist 101, the photoresist 101 is also formed with one or more photoactive compounds (PACs). The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1] hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzoinethyl ether, benzoinisopropylether, benzoin-n-butylether, benzoinphenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloroacetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the PACs are a photobase generator, the PACs may comprise quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may alternatively be utilized, and all such PACs are fully intended to be included within the scope of the present embodiments.

In an embodiment the PACs are formed by introducing the PACs as a third precursor material into the deposition chamber 107 using, e.g., a third precursor delivery system 123 and a third precursor gas controller 125, which is also controlled by the control unit 119. In an embodiment the third precursor delivery system 123 and the third precursor gas controller 125 are similar to the second precursor delivery system 122 and the second precursor gas controller 112, as described above, although they may alternatively be different.

In an embodiment the third precursor material is physically, not chemically, incorporated into a remainder of the photoresist 101. In the embodiment in which the third precursor material is triphenylsulfonium triflate, the third precursor material may be flowed into the deposition chamber 107 through the showerhead 113 at a flow rate of between about 100 mg/min and about 5000 mg/min, such as about 1000 mg/min. The third precursor material will be physically incorporated as part of the photoresist 101 as the photoresist 101 is being deposited onto the substrate 103.

Alternatively, the third precursor material may react with the elements of the carbon backbone or the first precursor material to form a polymer bound photoacid generator (PBP) instead of a stand-alone PAC. In this embodiment the structure of such a PBP depends at least in part upon the wavelength of energy (e.g., light) which the PBP will absorb to initiate the formation of the strong acid. However, in an embodiment in which the photoresist 101 will be exposed with a ArF excimer laser to absorb 193 nm wavelength of light, the PBP may have the following structure:

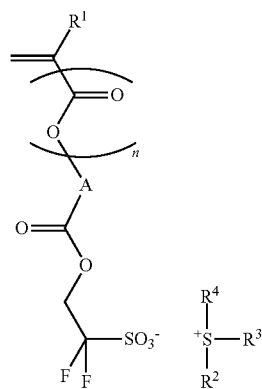

where $R^1$ is a hydrogen atom, a fluorine atom, a methyl group, or a trifluormethyl group; $R^2$, $R^3$, $R^4$ comprise 1 to 10 carbon atoms in an alkyl group, an alkenyl group, or an oxoalkyl group, comprise 6 to 18 carbon atoms in an aryl group, an aralkyl group, or an aryloxoalkyl group; A comprises 2 to 20 carbon atoms having a cyclic structure and may comprise a heteroatom; and n is either 0 or 1. Additionally, two of $R^2$, $R^3$, $R^4$ may bond together to form a ring with S.

In an alternative embodiment the photoresist 101 may be exposed using a KrF excimer laser, which emits light at a wavelength of 248 nm. In this embodiment the PBP may have the following structures:

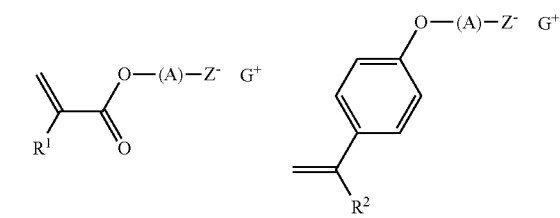

where $R^1$ and $R^2$ are a hydrogen atom, a fluorine atom, comprise 1 to 6 carbon atoms in a alkyl group or fluoroalkyl group; A is a fluorine-substituted alkylene group with 1 to 30 carbon atoms, a fluorine-substituted cycloalkylene group with 3 to 30 carbon atoms, a fluorine-substituted arylene group with 6 to 30 carbon atoms, a fluorine-substituted alkylene arylene group with 7 to 30 carbon atoms; Z is an anionic group comprising a sulfonate; and G is a photodecomposed cation group.

Additionally, as one of ordinary skill in the art will recognize, while the PBPs discussed above with respect to the ArF excimer laser and the KrF excimer laser may be used, the precise PBPs described are only intended to be illustrative and are not intended to be limiting upon the embodiments. Rather, any suitable structure that may be a photoacid generator and also be bound to the polymer within the polymer resin may alternatively. All such structures are fully intended to be included within the scope of the embodiments.

Additionally, instead of using only a single precursor material (e.g., the second precursor material described above) to provide monomers and polymers to attach to or be part of the carbon backbone, two or more precursor materials may be utilized. In an embodiment the second precursor material may be utilized as described above while a fourth precursor material may also be introduced to provide additional monomers and polymers. The fourth precursor material may comprise one or more of the repeating units as described above with respect to the second precursor material, but can also be utilized to help modify the properties of the photoresist 101.

For example, while the second precursor may be chosen to help assist the patterning resolution of the photoresist 101, the fourth precursor may be chosen to assist with other desirable properties, such as an etch selectivity of the photoresist 101 during a subsequent patterning process. In a particular example in which the second precursor is as described above, the fourth precursor may comprise a selectivity enhancing monomer or polymer such as the following:

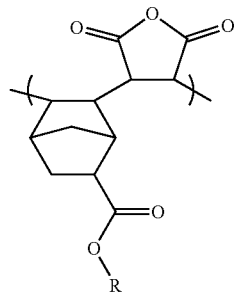

In an embodiment the fourth precursor is introduced into the deposition chamber 107 using, e.g., a fourth precursor delivery system 127 and a fourth precursor gas controller 129, which is also controlled by the control unit 119. In an embodiment the fourth precursor delivery system 127 and the fourth precursor gas controller 129 are similar to the second precursor delivery system 122 and the second precursor gas controller 112, as described above, although they may alternatively be different.

In an embodiment the fourth precursor is flowed into the deposition chamber 107 through the showerhead 113 at a flow rate of between about 100 mg/min and about 5000 mg/min, such as about 300 mg/min. The fourth precursor will be react with the first precursor, the second precursor, and, optionally, the third precursor, in order to help deposit the photoresist 101 onto the substrate 103. In a particular example in which the third precursors are not bonded to the polymers of the photoresist 101, the first precursor, the second precursor, and the fourth precursor react with each other to form the following polymer with a carbon-carbon double bonded backbone:

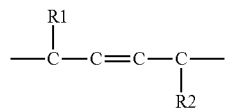

wherein R1 represents the monomers and polymers from the second precursor that are bonded to the carbon backbone and R2 represents the monomers and polymers from the fourth precursor that are bonded to the carbon backbone.

Optionally, other materials may be added to the photoresist 101 during deposition in order to assist in forming the photoresist 101 in achieving desirable properties. In an embodiment a cross-linking agent may also be added to the photoresist 101. The cross-linking agent reacts with the polymer resin within the photoresist 101 after exposure, assisting in increasing the cross-linking density of the photoresist, which helps to improve the resist pattern and resistance to dry etching. In an embodiment the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Specific examples of materials that may be utilized as a cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl) norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ethe-r of a phenol novolak resin, pentaerythritol tetra(3-acetoxy-2-hydroxyprop-yl)ether, pentaerythritol poly(3-chloroacetoxy-2-hydroxypropyl)ether, trimethylolmethane tri(3-acetoxy-2-hydroxypropyl)ether, combinations of these, or the like.

In addition to the polymer resins, the PACs, and the cross-linking agents, the photoresist 101 may also be formed with a number of other additives that will assist the photoresist 101 obtain the highest resolution. For example, the photoresist 101 may also be formed with surfactants in order to help improve the ability of the photoresist 101 to coat the surface on which it is applied. In an embodiment the surfactants may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, combinations of these, or the like.

Another additive that may be added to the photoresist 101 is a quencher, which may be utilized to inhibit diffusion of the generated acids/bases/free radicals within the photoresist 101, which helps the resist pattern configuration as well as to improve the stability of the photoresist 101 over time. In an embodiment the quencher is an amine such as a second lower aliphatic amine, a tertiary lower aliphatic amine, or the like. Specific examples of amines that may be used include trimethylamine, diethylamine, triethylamine, di-n-propylamine, tri-n-propylamine, tripentylamine, diethanolamine, and triethanolamine, alkanolamine, combinations of these, or the like.

Alternatively, an organic acid may be utilized as the quencher. Specific embodiments of organic acids that may be utilized include malonic acid, citric acid, malic acid, succinic acid, benzoic acid, salicylic acid, phosphorous oxo acid and its derivatives such as phosphoric acid and derivatives thereof such as its esters, such as phosphoric acid, phosphoric acid di-n-butyl ester and phosphoric acid diphenyl ester; phosphonic acid and derivatives thereof such as its ester, such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phosphinic acid and phenylphosphinic acid.

Another additive that may be added to the photoresist 101 is a stabilizer, which assists in preventing undesired diffusion of the acids generated during exposure of the photoresist 101. In an embodiment the stabilizer may include nitrogenous compounds such as aliphatic primary, secondary, and tertiary amines, cyclic amines such as piperidines, pyrrolidines, morpholines, aromatic heterocycles such as pyridines, pyrimidines, purines, imines such as diazabicycloundecene, guanidines, imides, amides, and others. Alternatively, ammonium salts may also be used for the stabilizer, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Yet another additive that may be added to the photoresist 101 may be a dissolution inhibitor in order to help control dissolution of the photoresist 101 during development. In an embodiment bile-salt esters may be utilized as the dissolution inhibitor. Specific examples of materials that may be utilized include cholic acid (IV), deoxycholic acid (V), lithocholic acid (VI), t-butyl deoxycholate (VII), t-butyl lithocholate (VIII), and t-butyl-3-α-acetyl lithocholate (IX).

Another additive that may be added to the photoresist 101 may be a plasticizer. Plasticizers may be used to reduce delamination and cracking between the photoresist 101 and underlying layers (e.g., the layer to be patterned 110) and may comprise monomeric, oligomeric, and polymeric plasticizers such as oligo- and polyethyleneglycol ethers, cycloaliphatic esters, and non-acid reactive steroidally-derived materials. Specific examples of materials that may be used for the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerine and the like.

Yet another additive that may be added include a coloring agent, which helps observers examine the photoresist 101 and find any defects that may need to be remedied prior to further processing. In an embodiment the coloring agent may be either a triarylmethane dye or, alternatively, may be a fine particle organic pigment. Specific examples of materials that may be used as coloring agents include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045) rhodamine 6G (C. I. 45160), Benzophenone compounds such as 2,4-dihydroxybenzophenone and 2,2',4,4'-tetrahydroxybenzophenone, salicylic acid compounds such as phenyl salicylate and 4-t-butylphenyl salicylate, phenylacrylate compounds such as ethyl-2-cyano-3,3-diphenylacrylate, and 2'-ethylhexyl-2-cyano-3,3-diphenylacrylate, benzotriazole compounds such as 2-(2-hydroxy-5-methylphenyl)-2H-benzotriazole, and 2-(3-t-butyl-2-hydroxy-5-methylphenyl)-5-chloro-2H-benzotriazole, coumarin compounds such as 4-methyl-7-diethylamino-1-benzopyran-2-one, thioxanthone compounds such as diethylthioxanthone, stilbene compounds, naphthalic acid compounds, azo dyes, Phthalocyanine blue, phthalocyanine green, iodine green, Victoria blue, naphthalene black, Photopia methyl violet, bromphenol blue and bromcresol green, laser dyes such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives may also be added to the photoresist 101 in order to promote adhesion between the photoresist 101 and an underlying layer upon which the photoresist 101 has been applied (e.g., the layer to be patterned 110). In an embodiment the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, 8-oxyquinoline, 4-hydroxypteridine and derivatives, 1,10-phenanthroline and derivatives, 2,2'-bipyridine and derivatives, benzotriazoles; organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations of these, or the like.

Each of these additives, if desired, may be introduced into deposition chamber 107 similar to the PACs such as by using a precursor delivery system (not individually illustrated in FIG. 1) such as the third precursor delivery system 123, although any other suitable method may alternatively be utilized. Once introduced to the deposition chamber 107, the desired additives will be physically incorporated into the photoresist 101 as the photoresist 101 is being deposited.

By utilizing the plasma block 120 along with the first precursor and the second precursor (and optionally with the other precursor materials), a solvent that is normally utilized for applying the photoresist 101 may be dispensed with and not used. Additionally, the carbon backbone of the deposited photoresist 101 can be formed having carbon-carbon double bonds. By incorporating double bonds into the carbon backbone, the resultant photoresist 101 can better withstand high energy exposures (further described below with respect to FIG. 3), such as an extreme ultraviolet radiation exposure, without breaking, leading to a more resilient and more efficient photoresist 101 when such high energy exposures are utilized to pattern the photoresist 101.

Figure 3:
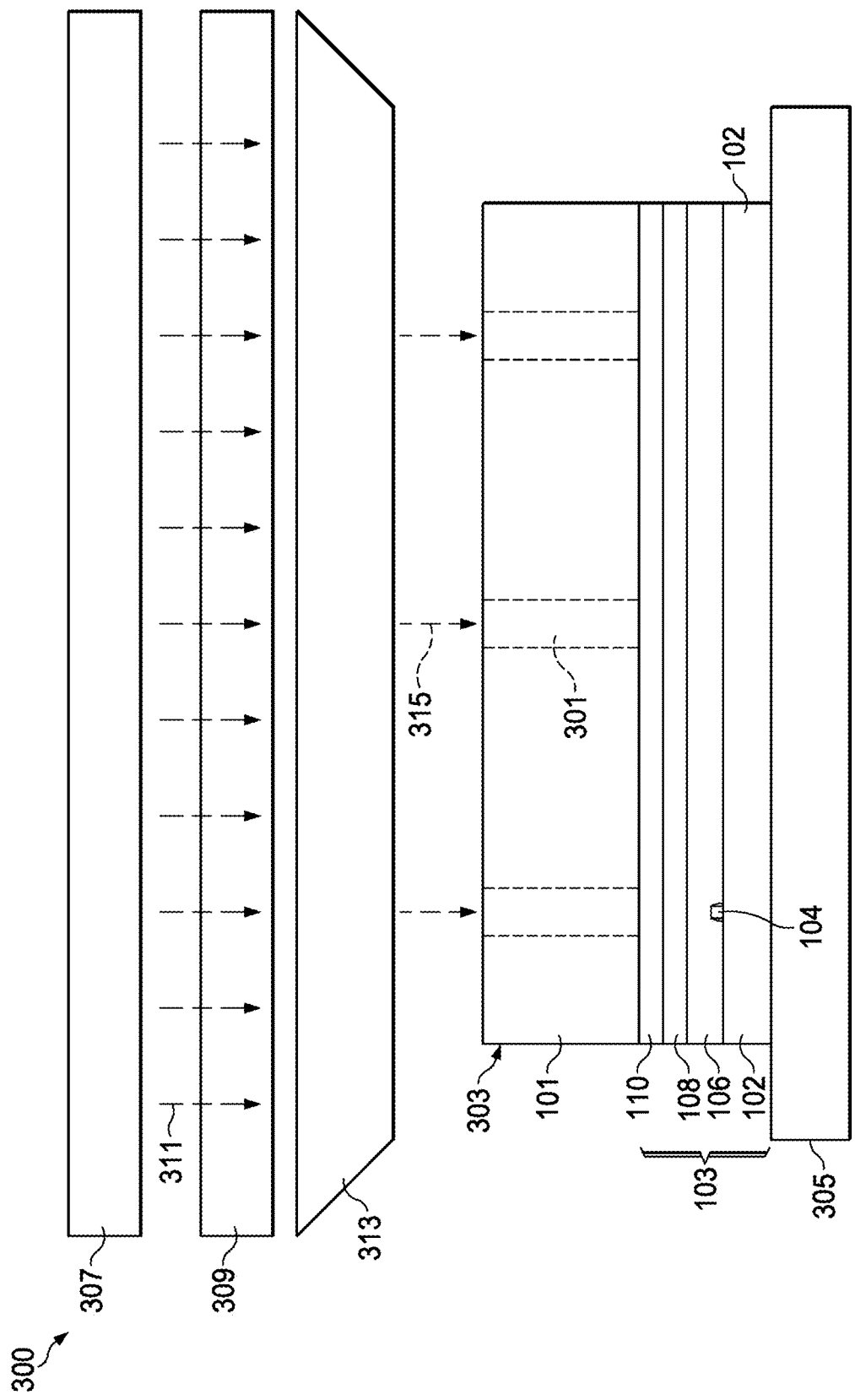
FIG. 3 illustrates an exposure of the photoresist in accordance with an embodiment.

FIG. 3 illustrates an exposure of the photoresist 101 to form an exposed region 301 and an unexposed region 303 within the photoresist 101. In an embodiment the exposure may be initiated by placing the substrate 103 and the photoresist 101 into an imaging device 300 for exposure. The imaging device 300 may comprise a support plate 305, an energy source 307, a patterned mask 309 between the support plate 305 and the energy source 307, and optics 313. In an embodiment the support plate 305 is a surface to which the substrate 103 and the photoresist 101 may be placed or attached to and which provides support and control to the substrate 103 during exposure of the photoresist 101. Additionally, the support plate 305 may be movable along one or more axes, as well as providing any desired heating or cooling to the substrate 103 and photoresist 101 in order to prevent temperature gradients from affecting the exposure process.

In an embodiment the energy source 307 supplies energy 311 such as light to the photoresist 101 in order to induce a reaction of the PACs, which in turn reacts with the polymer resin to chemically alter those portions of the photoresist 101 to which the energy 311 impinges. In an embodiment the energy 311 may be electromagnetic radiation, such as g-rays (with a wavelength of about 436 nm), i-rays (with a wavelength of about 365 nm), ultraviolet radiation, far ultraviolet radiation, extreme ultraviolet radiation (with a wavelength between about 10 nm and about 124 nm), x-rays, electron beams, or the like. The energy source 307 may be a source of the electromagnetic radiation, and may be a KrF excimer laser light (with a wavelength of 248 nm), an ArF excimer laser light (with a wavelength of 193 nm), a $F_2$ excimer laser light (with a wavelength of 157 nm), or the like, although any other suitable source of energy 311, such as mercury vapor lamps, xenon lamps, carbon arc lamps or the like, may alternatively be utilized.

The patterned mask 309 is located between the energy source 307 and the photoresist 101 in order to block portions of the energy 311 to form a patterned energy 315 prior to the energy 311 actually impinging upon the photoresist 101. In an embodiment the patterned mask 309 may comprise a series of layers (e.g., substrate, absorbance layers, anti-reflective coating layers, shielding layers, etc.) to reflect, absorb, or otherwise block portions of the energy 311 from reaching those portions of the photoresist 101 which are not desired to be illuminated. The desired pattern may be formed in the patterned mask 309 by forming openings through the patterned mask 309 in the desired shape of illumination.

Optics (represented in FIG. 3 by the trapezoid labeled 313) may be used to concentrate, expand, reflect, or otherwise control the energy 311 as it leaves the energy source 307, is patterned by the patterned mask 309, and is directed towards the photoresist 101. In an embodiment the optics 313 comprise one or more lenses, mirrors, filters, combinations of these, or the like to control the energy 311 along its path. Additionally, while the optics 313 are illustrated in FIG. 3 as being between the patterned mask 309 and the photoresist 101, elements of the optics 313 (e.g., individual lenses, mirrors, etc.) may also be located at any location between the energy source 307 (where the energy 311 is generated) and the photoresist 101.

In an embodiment the substrate 103 with the photoresist 101 is placed on the support plate 305. Once the pattern has been aligned to the substrate 103, the energy source 307 generates the desired energy 311 (e.g., light) which passes through the patterned mask 309 and the optics 313 on its way to the photoresist 101. The patterned energy 315 impinging upon portions of the photoresist 101 induces a reaction of the PACs within the photoresist 101. The chemical reaction products of the PACs' absorption of the patterned energy 315 (e.g., acids/bases/free radicals) then reacts with the polymer resin, chemically altering the photoresist 101 in those portions that were illuminated through the patterned mask 309.

In a specific example in which the patterned energy 315 is a 193 nm wavelength of light, the PAC is a photoacid generator, and the group to be decomposed is a carboxylic acid group on the hydrocarbon structure and a cross linking agent is used, the patterned energy 315 will impinge upon the photoacid generator and the photoacid generator will absorb the impinging patterned energy 315. This absorption initiates the photoacid generator to generate a proton (e.g., a $H^+$ ion) within the photoresist 101. When the proton impacts the carboxylic acid group on the hydrocarbon structure, the proton will react with the carboxylic acid group, chemically altering the carboxylic acid group and altering the properties of the polymer resin in general. The carboxylic acid group will then react with the cross-linking agent to cross-link with other polymer resins within the photoresist 101.

Optionally, the exposure of the photoresist 101 may occur using an immersion lithography technique. In such a technique an immersion medium (not individually illustrated in FIG. 3) may be placed between the imaging device 300 (and particularly between a final lens of the optics 313) and the photoresist 101. With this immersion medium in place, the photoresist 101 may be patterned with the patterned energy 315 passing through the immersion medium.

In this embodiment a protective layer (also not individually illustrated in FIG. 3) may be formed over the photoresist 101 in order to prevent the immersion medium from coming into direct contact with the photoresist 101 and leaching or otherwise adversely affecting the photoresist 101. In an embodiment the protective layer is insoluble within the immersion medium such that the immersion medium will not dissolve it and is immiscible in the photoresist 101 such that the protective layer will not adversely affect the photoresist 101. Additionally, the protective layer is transparent so that the patterned energy 315 may pass through the protective layer.

In an embodiment the protective layer comprises a protective layer resin within a protective layer solvent. The material used for the protective layer solvent is, at least in part, dependent upon the components chosen for the photoresist 101, as the protective layer solvent should not dissolve the materials of the photoresist 101 so as to avoid degradation of the photoresist 101 during application and use of the protective layer. In an embodiment the protective layer solvent includes alcohol solvents, fluorinated solvents, and hydrocarbon solvents.

Specific examples of materials that may be utilized for the protective layer solvent include methanol, ethanol, 1-propanol, isopropanol, n-propanol, 1-butanol, 2-butanol, 2-methyl-2-propanol, 3-methyl-1-butanol, isobutyl alcohol, tert-butyl alcohol, 1-pentanol, 2-pentanol, 3-pentanol, n-hexanol, cyclohecanol, 1-hexanol, 1-heptanol, 1-octanol, 2-hexanol, 2-heptanol, 2-octanol, 3-hexanol, 3-heptanol, 3-octanol, 4-octanol, 2-methyl-2-butanol, 3-methyl-1-butanol, 3-methyl-2-butanol, 2-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-diol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, perfluorotetrapentylamine, toluene, xylene and anisole, and aliphatic hydrocarbon solvents, such as n-heptane, n-nonane, n-octane, n-decane, 2-methylheptane, 3-methylheptane, 3,3-dimethylhexane, 2,3,4-trimethylpentane, combinations of these, or the like.

The protective layer resin may comprise a protective layer repeating unit. In an embodiment the protective layer repeating unit may be an acrylic resin with a repeating hydrocarbon structure having a carboxyl group, an alicyclic structure, an alkyl group having one to five carbon atoms, a phenol group, or a fluorine atom-containing group. Specific examples of the alicyclic structure include a cyclohexyl group, an adamantyl group, a norbornyl group, a isobornyl group, a tricyclodecyl group, a tetracyclododecyl group, and the like. Specific examples of the alkyl group include an n-butyl group, an isobutyl group, or the like. However, any suitable protective layer resin may alternatively be utilized.

The protective layer composition may also include additional additives to assist in such things as adhesion, surface leveling, coating, and the like. For example, the protective layer composition may further comprise a protective layer surfactant, although other additives may also be added, and all such additions are fully intended to be included within the scope of the embodiment. In an embodiment the protective layer surfactant may be an alkyl cationic surfactant, an amide-type quaternary cationic surfactant, an ester-type quaternary cationic surfactant, an amine oxide surfactant, a betaine surfactant, an alkoxylate surfactant, a fatty acid ester surfactant, an amide surfactant, an alcohol surfactant, an ethylenediamine surfactant, or a fluorine- and/or silicon-containing surfactant.

Specific examples of materials that may be used for the protective layer surfactant include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyooxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

Prior to application of the protective layer onto the photoresist 101, the protective layer resin and desired additives are first added to the protective layer solvent to form a protective layer composition. The protective layer solvent is then mixed to ensure that the protective layer composition has a consistent concentration throughout the protective layer composition.

Once the protective layer composition is ready for application, the protective layer composition may be applied over the photoresist 101. In an embodiment the application may be performed using a process such as a spin-on coating process, a dip coating method, an air-knife coating method, a curtain coating method, a wire-bar coating method, a gravure coating method, a lamination method, an extrusion coating method, combinations of these, or the like. In an embodiment the protective layer composition may be applied such that it has a thickness over the surface of the photoresist 101 of about 100 nm.

After the protective layer composition has been applied to the photoresist 101, a protective layer pre-bake may be performed in order to remove the protective layer solvent. In an embodiment the protective layer pre-bake may be performed at a temperature suitable to evaporate the protective layer solvent, such as between about 40° C. and 150° C., although the precise temperature depends upon the materials chosen for the protective layer composition. The protective layer pre-bake is performed for a time sufficient to cure and dry the protective layer composition, such as between about 10 seconds to about 5 minutes, such as about 90 seconds.

Once the protective layer has been placed over the photoresist 101, the substrate 103 with the photoresist 101 and the protective layer are placed on the support plate 305, and the immersion medium may be placed between the protective layer and the optics 313. In an embodiment the immersion medium is a liquid having a refractive index greater than that of the surrounding atmosphere, such as having a refractive index greater than 1. Examples of the immersion medium may include water, oil, glycerine, glycerol, cycloalkanols, or the like, although any suitable medium may alternatively be utilized.

The placement of the immersion medium between the protective layer and the optics 313 may be done using, e.g., an air knife method, whereby fresh immersion medium is applied to a region between the protective layer and the optics 313 and controlled using pressurized gas directed towards the protective layer to form a barrier and keep the immersion medium from spreading. In this embodiment the immersion medium may be applied, used, and removed from the protective layer for recycling so that there is fresh immersion medium used for the actual imaging process.

However, the air knife method described above is not the only method by which the photoresist 101 may be exposed using an immersion method. Any other suitable method for imaging the photoresist 101 using an immersion medium, such as immersing the entire substrate 103 along with the photoresist 101 and the protective layer, using solid barriers instead of gaseous barriers, or using an immersion medium without a protective layer, may also be utilized. Any suitable method for exposing the photoresist 101 through the immersion medium may be used, and all such methods are fully intended to be included within the scope of the embodiments.

After the photoresist 101 has been exposed to the patterned energy 315, a post-exposure baking may be used in order to assist in the generating, dispersing, and reacting of the acid/base/free radical generated from the impingement of the patterned energy 315 upon the PACs during the exposure. Such assistance helps to create or enhance chemical reactions which generate chemical differences between the exposed region 301 and the unexposed region 303 within the photoresist 101. These chemical differences also caused differences in the solubility between the exposed region 301 and the unexposed region 303. In an embodiment this post-exposure baking may occur at temperatures of between about 50° C. and about 160° C. for a period of between about 40 seconds and about 120 seconds.

Figure 4:
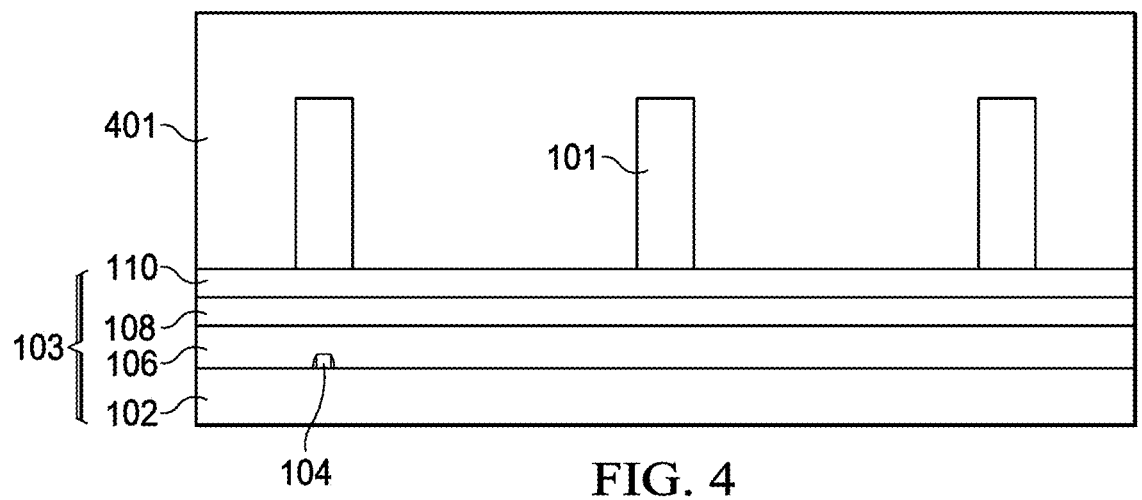
FIG. 4 illustrates an development of the exposed photoresist with a developer in accordance with an embodiment.

FIG. 4 illustrates a development of the photoresist 101 after the photoresist 101 has been exposed with the use of a developer 401. After the photoresist 101 has been exposed and the post-exposure baking has occurred, the photoresist 101 may be developed using either a positive tone developer or a negative tone developer, depending upon the desired pattern for the photoresist 101 and the components chosen for the photoresist 101. In an embodiment in which the exposed region 301 of the photoresist 101 is desired to be removed to form a positive tone, a positive tone developer such as a basic aqueous solution may be utilized to remove those portions of the photoresist 101 which were exposed to the patterned energy 315 and which have had their solubility modified and changed through the chemical reactions. Such basic aqueous solutions may include tetra methyl ammonium hydroxide (TMAH), tetra butyl ammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, potassium metasilicate, sodium carbonate, tetraethylammonium hydroxide, combinations of these, or the like.

If a negative tone development is desired, an organic solvent or critical fluid may be utilized to remove those portions of the photoresist 101 which were not exposed to the energy and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

However, as one of ordinary skill in the art will recognize, the above description of positive tone developers and negative tone developers are only intended to be illustrative and are not intended to limit the embodiments to only the developers listed above. Rather, any suitable type of developer, including acid developers or even water developers, that may be utilized to selectively remove a portion of the photoresist 101 that has a different property (e.g., solubility) than another portion of the photoresist 101, may alternatively be utilized, and all such developers are fully intended to be included within the scope of the embodiments.

In an embodiment in which immersion lithography is utilized to expose the photoresist 101 and a protective layer is utilized to protect the photoresist 101 from the immersion medium, the developer 401 may be chosen to remove not only those portions of the photoresist 101 that are desired to be removed, but may also be chosen to remove the protective layer in the same development step. Alternatively, the protective layer may be removed in a separate process, such as by a separate solvent from the developer 401 or even an etching process to remove the protective layer from the photoresist 101 prior to development.

The developer 401 may be applied to the photoresist 101 using, e.g., a spin-on process. In this process the developer 401 is applied to the photoresist 101 from above the photoresist 101 while the substrate 103 (and the photoresist 101) is rotated. In an embodiment the developer 401 may be supplied at a rate of between about 5 ml/min and about 800 ml/min, such as about 300 ml/min, while the substrate 103 is being rotated at a speed of between about 100 rpm and about 2000 rpm, such as about 1000 rpm. In an embodiment the developer 401 may be at a temperature of between about 10° C. and about 80° C., such as about 50° C., and the development may continue for between about 1 minute to about 60 minutes, such as about 30 minutes.

However, while the spin-on method described herein is one suitable method for developing the photoresist 101 after exposure, it is intended to be illustrative and is not intended to limit the embodiment. Rather, any suitable method for development, including dip processes, puddle processes, and spray-on methods, may alternatively be used. All such development processes are fully intended to be included within the scope of the embodiments.

Figure 5:
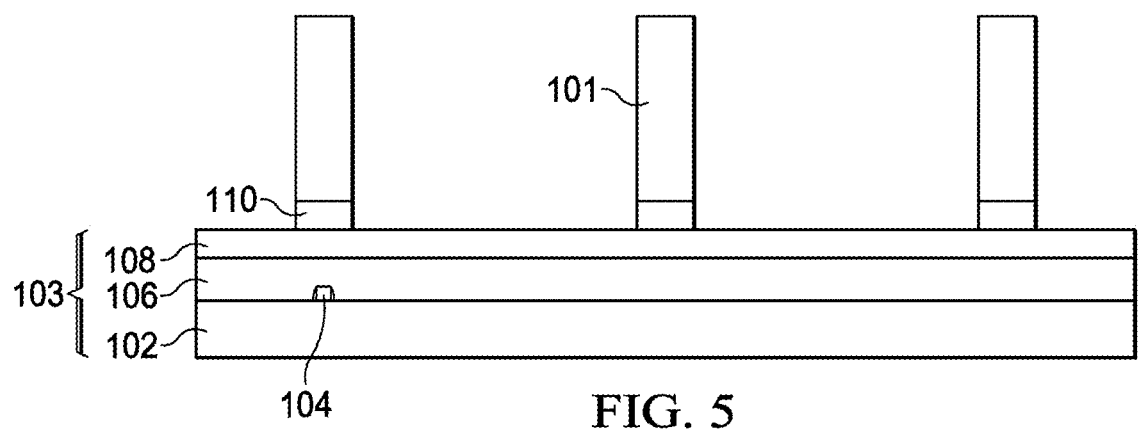
FIG. 5 illustrates a removal of the developer in accordance with an embodiment.

FIG. 5 illustrates a removal of the developer 401 along with an illustration of the photoresist 101 after it has been developed with the developer 401. In an embodiment the developer 401 may be removed using, e.g., a spin-dry process, although any suitable removal technique may alternatively be utilized.

Additionally, FIG. 5 also illustrates that, after the photoresist 101 has been developed, additional processing may be performed on the layer to be patterned 110 while the photoresist 101 is in place. As one example, a reactive ion etch or other etching process may be utilized, to transfer the pattern of the photoresist 101 to the underlying layer to be patterned 110. Alternatively, in an embodiment in which the layer to be patterned 110 is a seed layer, the layer to be patterned 110 may be plated in order to form, e.g., a copper pillar, or other conductive structure in the opening of the photoresist 101. Any suitable processing, whether additive or subtractive, that may be performed while the photoresist 101 is in place may be performed, and all such additional processing are fully intended to be included within the scope of the embodiments.

In accordance with an embodiment, a method of manufacturing a semiconductor device comprising supplying a first precursor to a deposition chamber, the first precursor comprising at least one carbon-carbon double bond is provided. The first precursor is reacted with a second precursor in a deposition chamber, wherein the reacting the first precursor with the second precursor deposits a photoresist onto a substrate, the photoresist comprising a carbon backbone with at least one carbon-carbon double bond.

In accordance with another embodiment, a method of manufacturing a semiconductor device comprising turning a first precursor into a first precursor plasma in a remote plasma chamber and introducing the first precursor plasma into a deposition chamber is provided. A second precursor is introduced into the deposition chamber, the second precursor comprising a first plurality of monomers and a photoresist is formed from a reaction of the first precursor plasma and the second precursor and deposited onto a substrate within the deposition chamber, wherein the photoresist comprises a carbon backbone, the carbon backbone comprising at least one carbon-carbon double bond.

In accordance with yet another embodiment, a photoresist comprising a carbon backbone, wherein the carbon backbone comprises at least one linear section with a carbon-carbon double bond, is provided. One or more monomers is attached to the carbon backbone.

Although the present embodiments and their advantages have been described in detail, it should be understood that various changes, substitutions and alterations can be made herein without departing from the spirit and scope of the disclosure as defined by the appended claims. For example, the materials and processes described herein are intended for illustrative purposes only, as the precursor materials may be modified. Additionally, the embodiments may be used in a variety of photoresist processes.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
   depositing a photoresist layer over a layer to be patterned, the depositing the photoresist layer comprising at least in part a plasma-based process, wherein after the depositing the photoresist layer the photoresist layer comprises:
   a carbon backbone, wherein a carbon-carbon double bond is within the carbon backbone;
   one or more monomers attached to the carbon backbone, wherein a ratio of the carbon-carbon double bonds to carbon-carbon single bonds on the carbon backbone is greater than zero and less than about 40%; and
   a cross-linking agent, wherein the cross-linking agent is part of a compositional component of the photoresist layer;
   imaging the photoresist layer;
   developing the photoresist layer after the imaging the photoresist layer; and
   patterning the layer to be patterned with the photoresist layer as a mask.

2. The method of claim 1, wherein the plasma-based process utilizes propene.

3. The method of claim 1, wherein the plasma-based process comprises lowering an ignition temperature by flowing a second precursor with a plasma precursor.

4. The method of claim 1, wherein the photoresist layer further comprises a polymer bound photoacid generator.

5. The method of claim 4, wherein the polymer bound photoacid generator further comprises the following structure:

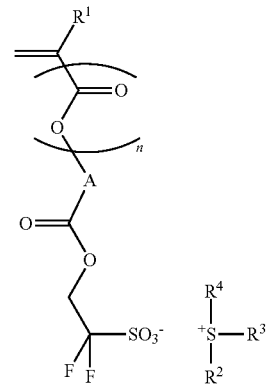

where $R^1$ is a hydrogen atom, a fluorine atom, a methyl group, or a trifluormethyl group; $R^2$, $R^3$, $R^4$ comprise 1 to 10 carbon atoms in an alkyl group, an alkenyl group, or an oxoalkyl group, comprise 6 to 18 carbon atoms in an aryl group, an aralkyl group, or an aryloxoalkyl group; A comprises 2 to 20 carbon atoms having a cyclic structure and may comprise a heteroatom; and n is either 0 or 1.

6. The method of claim 1, wherein the plasma-based process utilizes butene.

7. The method of claim 1, wherein the plasma-based process utilizes pentene.

8. A method of manufacturing a semiconductor device, the method comprising:
   introducing a first gaseous precursor and a second gaseous precursor to a semiconductor substrate to deposit a photoresist, wherein a first one of the first gaseous precursor and the second gaseous precursor is a plasma and a second one of the first gaseous precursor and the second gaseous precursor is not a plasma, wherein the photoresist comprises a carbon backbone, the carbon backbone comprising at least one carbon-carbon double bond, wherein the carbon-carbon double bonds in the carbon backbone are no greater than 40% of the carbon-carbon bonds in the carbon backbone; and etching a layer located between the photoresist and the semiconductor substrate through the photoresist after the introducing the first gaseous precursor and the second gaseous precursor.

9. The method of claim 8, wherein one of the first gaseous precursor and the second gaseous precursor comprises propene.

10. The method of claim 9, wherein the second gaseous precursor comprises the following structure:

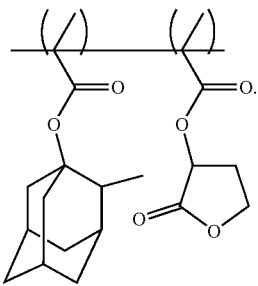

11. The method of claim 8, wherein the photoresist further comprises a cross-linking agent, wherein the cross-linking agent is part of a compositional component of the photoresist.

12. The method of claim 8, wherein the photoresist further comprises a polymer bound photoacid generator.

13. The method of claim 12, wherein the polymer bound photoacid generator further comprises the following structure:

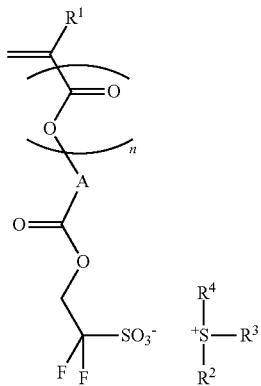

where $R^1$ is a hydrogen atom, a fluorine atom, a methyl group, or a trifluormethyl group; $R^2$, $R^3$, $R^4$ comprise 1 to 10 carbon atoms in an alkyl group, an alkenyl group, or an oxoalkyl group, comprise 6 to 18 carbon atoms in an aryl group, an aralkyl group, or an aryloxoalkyl group; A comprises 2 to 20 carbon atoms having a cyclic structure and may comprise a heteroatom; and n is either 0 or 1.

14. The method of claim 8, wherein one of the first gaseous precursor and the second gaseous precursor comprises butene.

15. A method of manufacturing a semiconductor device, the method comprising:
    placing a semiconductor substrate into a deposition chamber;
    flowing a plasma into the deposition chamber; and
    flowing a first gas into the deposition chamber simultaneously with the flowing the plasma, wherein the plasma and the first gas react to form a photoresist layer over the semiconductor substrate, the photoresist layer comprising a carbon backbone with carbon-carbon double bonds.

16. The method of claim 15, wherein the plasma is a plasma of propene.

17. The method of claim 15, further comprising creating the plasma by flowing a plasma precursor into a remote plasma block.

18. The method of claim 17, wherein the flowing the plasma precursor into the remote plasma block is performed at a flow rate of between about 100 sccm and about 2,000 sccm.

19. The method of claim 15, wherein the first gas comprises the following structure:

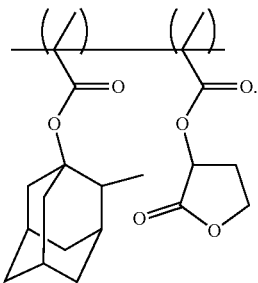

20. The method of claim 15, wherein the photoresist layer further comprises a cross-linking agent, wherein the cross-linking agent is part of a compositional component of the photoresist.

* * * * *